United States Patent
Afghahi et al.

(10) Patent No.: US 6,728,130 B1
(45) Date of Patent: Apr. 27, 2004

(54) VERY DENSE SRAM CIRCUITS

(75) Inventors: Morteza Cyrus Afghahi, Mission Viejo, CA (US); Esin Terzioglu, Aliso Viejo, CA (US); Gil Winograd, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/447,647

(22) Filed: May 29, 2003

Related U.S. Application Data
(60) Provisional application No. 60/420,237, filed on Oct. 22, 2002.

(51) Int. Cl.[7] .............................................. G11C 11/00
(52) U.S. Cl. ........................ 365/156; 365/207; 365/210
(58) Field of Search ........................ 365/156, 49, 210, 365/189.09, 189.08, 190, 207, 189.07, 154

(56) References Cited

U.S. PATENT DOCUMENTS

| | | | | |
|---|---|---|---|---|
| 5,675,529 A | * | 10/1997 | Poole | 365/63 |
| 5,955,899 A | * | 9/1999 | Afghahi | 327/65 |
| 6,091,627 A | * | 7/2000 | Luo et al. | 365/154 |
| 6,111,780 A | * | 8/2000 | Bertin | 365/154 |
| 6,301,146 B1 | * | 10/2001 | Ang et al. | 365/154 |
| 2003/0147272 A1 | * | 8/2003 | Joshi et al. | 365/156 |
| 2003/0198070 A1 | * | 10/2003 | Afghahi | 365/49 |

* cited by examiner

Primary Examiner—Richard Elms
Assistant Examiner—Hien Nguyen
(74) Attorney, Agent, or Firm—James Harrison; Bruce Garlick; Tim Markison

(57) ABSTRACT

An SRAM cell eliminates the p-channel pull-up resistors to decrease its physical size. A tracking circuit generates a control signal used to ensure that the memory state is preserved during the idle state. The control signal controls the wordline voltage during the idle state to vary the leakage through the access transistors to ensure that current into the node through the access device is not exceeded by leakage current out of the output nodes through the storage devices. The tracking circuit control signal can also be used to vary the well to substrate bias voltage of the storage devices to decrease the leakage through the storage devices. The control signal can also be used to bias the supply rail voltage to which the storage devices are directly coupled to decrease the amount of leakage through the storage devices. The tracking circuit comprises a number of half configured memory cells that are placed in a state which mimics the stored state in a normal memory cell that would degrade during the idle state. A differential amplifier detects when the output state of the dummy cells have fallen below a predetermined reference voltage. The differential amplifier generates the control signal at a level required to restore the output state to at or near the reference voltage.

12 Claims, 7 Drawing Sheets

VERY DENSE SRAM CIRCUITS

CROSS-REFERENCE TO RELATED APPLICATION(S)

This application claims priority to and incorporates by reference U.S. Provisional Application entitled, "Very Dense SRAM Circuits", having a Ser. No. of 60/420,237 and a filing date of Oct. 22, 2002.

BACKGROUND OF THE INVENTION

1. Technical Field of the Invention

This invention relates to memory circuits, and more particularly to SRAM memory circuits.

2. Description of Related Art

As a result of the never-ending quest to integrate more circuitry onto a single integrated circuit, designers are driven to find ways in which to increase the density of their circuit designs. The goal of integrating entire systems on a chip (SOC) has resulted in the motivation to include more memory capacity for those systems, particularly in view of the speed advantage in accessing integrated memory rather than off-chip.

One of the ways in which circuitry in general has become more dense is to simply shrink the circuitry photolithographically. Although steady gains in the ability to further shrink feature sizes has been beneficial, the rate at which such gains are being made has tapered off recently. Another technique for making circuits smaller is to eliminate devices from the circuit design. This can reduce not only the silicon real estate occupied by the circuit devices, but also the additional interconnect typically required for those devices.

With respect to memory cells, and SRAM cells particularly, attempts have been made to reduce their gate count while maintaining proper performance and reliability. FIG. 1 illustrates a standard prior art SRAM cell. Access transistors 30 and 14 isolate the cell and selectively access the cell during read and write operations. Transistors 9 and 7 are storage transistors that effectively store a binary one and zero state on the Q 28 and Qbar 18 output nodes of the cell. The storage transistors can be pull-up or pull-down transistors, depending upon the design of the cell. In the case of the cell in FIG. 1, they are pull-down transistors. The state of the cell is programmed during a write operation, and then isolated by the access transistors. The bi-stable nature of the storage devices is designed to hold the state until it is flipped by a write of an opposite polarity.

The P-channel transistors 24, 20 perform two functions in the cell of FIG. 1. First, they can assist a change of state to VDD during a write operation that is flipping the state of the cell. The second function is to supply charge to nodes 28 and 18 during the idle state. By doing so, they effectively replenish charge lost from isolated nodes 28 and 18 (whichever is at VDD) due to leakage through the pull-down storage transistors 9, 7. Although access transistors can and do provide some replenishing charge to nodes 28 and 18 (whichever is at VDD) through leakage current of their own, the magnitude of the leakage they provide by itself is not guaranteed to be sufficient to exceed the outflow from output nodes 28, 18, which is required to maintain the VDD state.

One way to shrink a cell such as the one in FIG. 1 is to replace the p-channel pull-ups 24, 20 with resistors. This can provide some additional density if the resistors can be implemented on a separate integrated circuit processing layer such that the resistors can overlap the cell transistors. Another solution is to simply eliminate the pull-up transistors altogether. The assistance they provide in flipping the cell state is not absolutely necessary, and in fact while one is helping, the other is actually resisting the change in state on the other side of the cell, increasing the power dissipation and write time of the cell. It is because the pull-ups are always the weakest of the three types of devices that the cell operates correctly. However, if the pull-up transistors are eliminated, there must be another way to ensure that the leakage provided by the access transistors is not exceeded by the leakage out of the nodes 28, 18, or the VDD state on one of the output nodes will deteriorate over time. This is difficult because the proper operation of the cell requires that the storage device be the largest and therefore the strongest in terms of current.

As a result, eliminating the p-channel devices as a solution to shrinking the memory cell has met with varying success. Some additional important points with regard to the operation of the SRAM cell of FIG. 1 should be noted. There is a hierarchy with respect to the relative strength of the devices in the SRAM cell. Storage transistors 9 and 7 should be the strongest transistors. Slightly less strong are the access transistors 30, 14. The weakest transistor will be the P-channel pull-up transistors 24, 20. The reason that the storage transistors 9, 7 must be stronger than the access transistors 30, 14 is that during a read operation, the access transistor 30, 14 should not be so strong as to disturb the state of the SRAM cell during the read. This is referred to as the beta ratio which is the ratio of relative strength between the pull-down transistors 9, 7 and the access transistors 30, 14. Typically, a beta ratio of greater than 1.5 is desirable to ensure that the cell is stable and will not be disturbed during a read access. This ratio virtually assures that the leakage supplied by the access transistor will not exceed the leakage through the storage devices.

Therefore, there is still a need in the art for SRAM cells that are as device efficient as possible, while still providing optimal and reliable performance.

BRIEF SUMMARY OF THE INVENTION

An embodiment of a dense memory cell in accordance with the invention includes two access transistors, each having a gate tied to a wordline input, a first one of the access transistors having a drain and source coupled between a bit line and an output node. The cell further includes two storage transistors, a first one having a drain and source coupled between the output line and a power signal and a gate couple to an output bar node, the second one having a drain and source coupled between the output bar node and the power rail, and a gate coupled to the output node. The cell also has a control circuit generating a tracking voltage coupled to the wordline, the track voltage for adjusting the voltage on the wordline during an idle state to ensure that leakage current through the two access transistors exceeds the leakage through the two storage transistors where the output node to which it is coupled is at VDD. The track voltage is a function of a reference voltage determined to provide a leakage through the access transistors that exceeds the leakage through the storage devices. The tracking voltage is buffered to substantially reduce disturbances to a reference voltage resulting from switching states on the wordline.

An embodiment of tracking circuit that generates the tracking voltage is a reference circuit, the reference circuit that includes a plurality of partial memory cells, each partial memory cell comprising one access transistor and storage transistor configured in a worst case leakage condition. It includes a differential amplifier having a voltage reference input and a second input coupled to an output node of each of the partial memory cells, the output of the differential amplifier being the tracking voltage.

An embodiment of the memory cell of the invention includes two access transistors, each having a gate tied to a well bias input, a first one of the access transistors having a drain and source coupled between a bit line and an output node, and two storage transistors, a first one having a drain and source coupled between the output line and a power signal and a gate couple to an output bar node, the second one having a drain and source coupled between the output bar node and the power signal, and a gate coupled to the output node. A control circuit generating a tracking voltage is coupled to the well bias. The track voltage for adjusting the voltage on the well bias during an idle state ensures that leakage current through the two access transistors exceeds the leakage through the two storage transistors where the output node to which it is coupled is at VDD.

An embodiment of the memory cell of the invention includes two access transistors, each having a gate tied to a power signal input, a first one of the access transistors having a drain and source coupled between a bit line and an output node. It further includes two storage transistors, a first one having a drain and source coupled between the output line and the power signal and a gate couple to an output bar node, the second one having a drain and source coupled between the output bar node and the power rail, and a gate coupled to the output node. It further includes a control circuit generating a tracking voltage coupled to the power signal, the track voltage for adjusting the voltage on the power signal during an idle state to ensure that leakage current through the two access transistors exceeds the leakage through the two storage transistors where the output node to which it is coupled is at VDD.

BRIEF DESCRIPTION OF THE DRAWINGS

The invention may be better understood, and its numerous objectives, features and advantages made apparent to those skilled in the art by referencing the accompanying drawings. The use of the same reference number throughout the several figures designates a like or similar element.

DETAILED DESCRIPTION OF THE INVENTION

The SRAM cell of the present invention eliminates the p-channel pull-up transistors and overcomes the problem of ensuring that the leakage current through the storage transistors of the cell does not exceed the leakage current supplied by the access transistors. The invention employs an active technique for controlling the leakage at the output nodes Q and Qbar of the cell.

Figure 1:
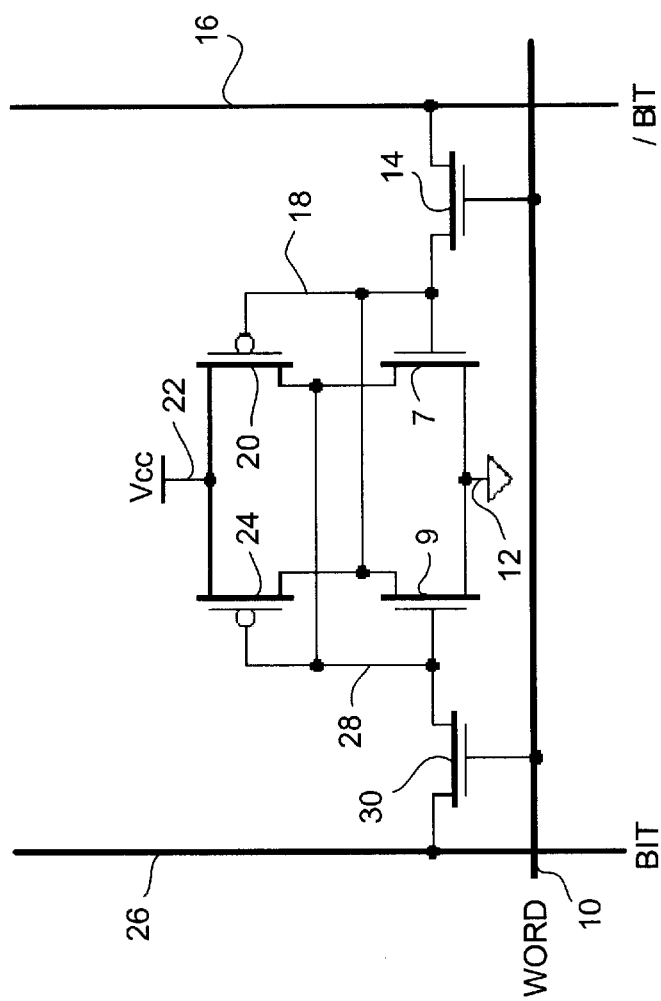
FIG. 1 illustrates a prior art SRAM cell.
Figure 2:
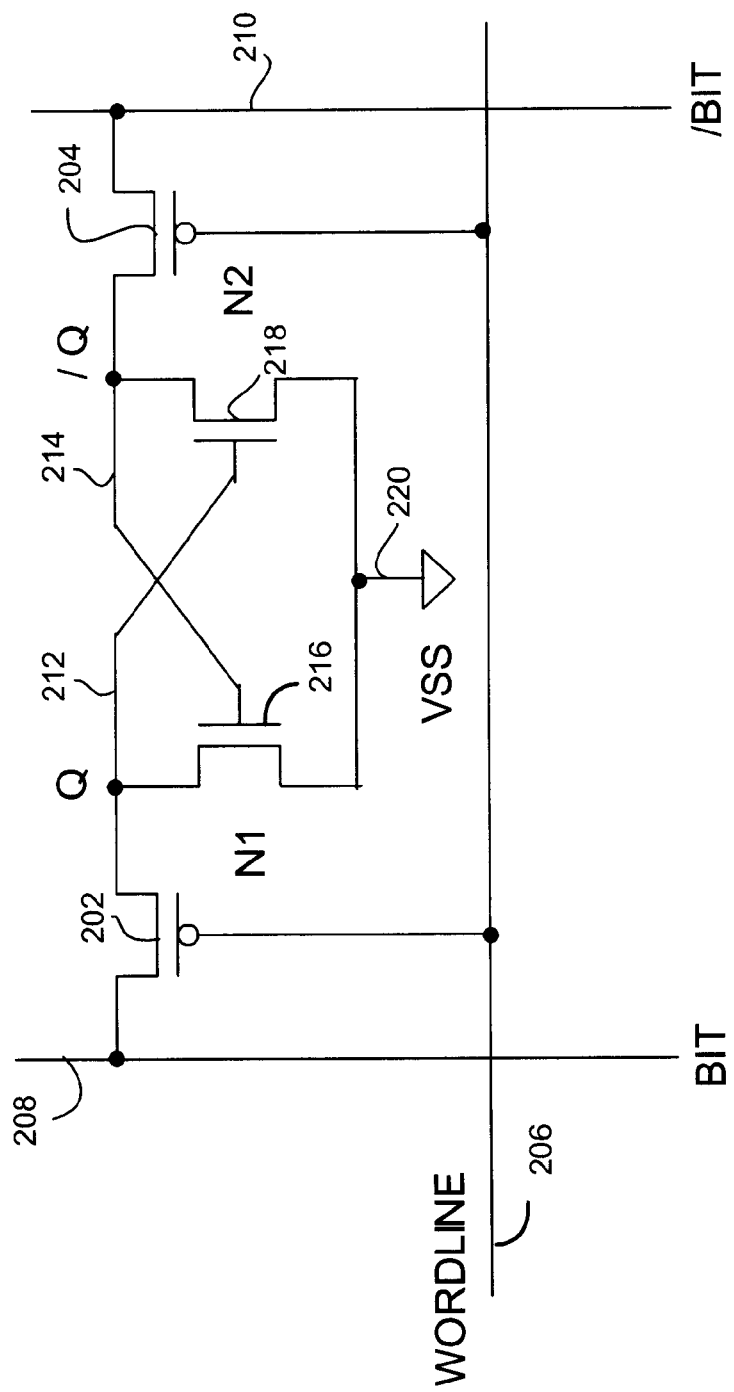
FIG. 2 illustrates an SRAM cell implemented in accordance with the present invention.

An embodiment of the SRAM cell of the present invention is illustrated in FIG. 2. As can be seen from the circuit diagram, the pull-up transistors 24, 20 of FIG. 1 have been eliminated from the cell. Another difference from the prior art cell is that the access transistors 202, 204 have been converted from the N-channel devices 30, 14 to P-channel devices. The primary motivation is that by eliminating the P-channel pull-up devices 24, 20 of FIG. 1, the process of writing a binary one state (i.e. VDD) into the cell becomes more difficult through an N-channel access transistor. This is because additional charge that was once provided through the eliminated P-channel pull-up devices 202, 204 is no longer available to assist the change in state.

The operation of the SRAM cell of FIG. 2 provides typical memory cell operation during a read. First bit lines 208, 210 are pre-charged to VDD. Next, word line 206 is brought active high, which in turn turns on access transistors 202, 204. Assuming for example, that the Q output node 212 is at VSS and Qbar output 214 is at VDD, the pre-charge on bit line 208 will then be drained through the access transistor and through the storage transistor 216 to VSS 220. This forces bit line 208 to VSS and the zero state of the SRAM cell is then sensed through a sense amplifier which is not shown.

During a write operation, data is imposed on bit lines 208, 210. Assuming that a binary 1 is to be written into the cell, bit line 208 will be at VDD. When word line 206 is brought to an active level, access transistors 202, 204 turn on and access transistor 202 pulls the Q node 212 up to VDD as supplied by bit line 208. Likewise, access transistor 204 attempts to pull the Q output 214 down to VSS, which is supplied by bit line 210. Even though access transistor 204 has difficulty pulling node 214 to VSS, the fact that a strong binary 1 is registered on node 212 causes storage pull-down transistor 218 to pull node 214 completely to VSS.

During the idle state (i.e. when the cell is not being accessed for a read or write), there is leakage current flowing out of the output node through the storage pull-down transistor 216, as well as leakage flowing into the node through access transistor 202. To ensure proper stability of the SRAM state, the leakage current through the access transistor 202 must always be larger than the leakage current through 216. Otherwise, the VDD level which is currently stored in the cell and reflected at node 212 will eventually degrade if the amount of charge lost through storage pull-down transistor 216 exceeds the leakage that can be supplied through access transistor 202.

One way to ensure that the leakage problem never occurs is to keep the BIT line mostly at or near VDD or VSS (depending upon what type of transistor it is) so that the magnitude of the leakage through the access transistor is great enough to exceed the leakage out of the output nodes when at VDD, thereby maintaining the data at Q, Qbar during the idle state. One way to accomplish this is to simply establish lower bound ratio between the size of the access and the storage transistor to ensure that the Q, Qbar output nodes will never lose information for all process corners, supply voltage fluctuations and temperatures. Maintaining this ratio leads to extreme overkill for access transistor leakage current. This solution will require a process modification and increases the leakage power consumption through the storage pull-down (or pull-up for a mirror image cell topology) and eats up most of the read current.

The solution therefore is to actively control the leakage into and/or out of the output nodes of the memory cell to ensure that the state remains stable during idle mode, while trying to minimize the amount of leakage to only that which is necessary to achieve the result. One way to accomplish this without altering the ratio between the access transistor and the storage transistor is to establish that voltage on the wordline 206 during the idle state that provides just enough leakage through the access transistor to ensure data will be retained, while trying to minimize the increased power dissipation.

Figure 3:
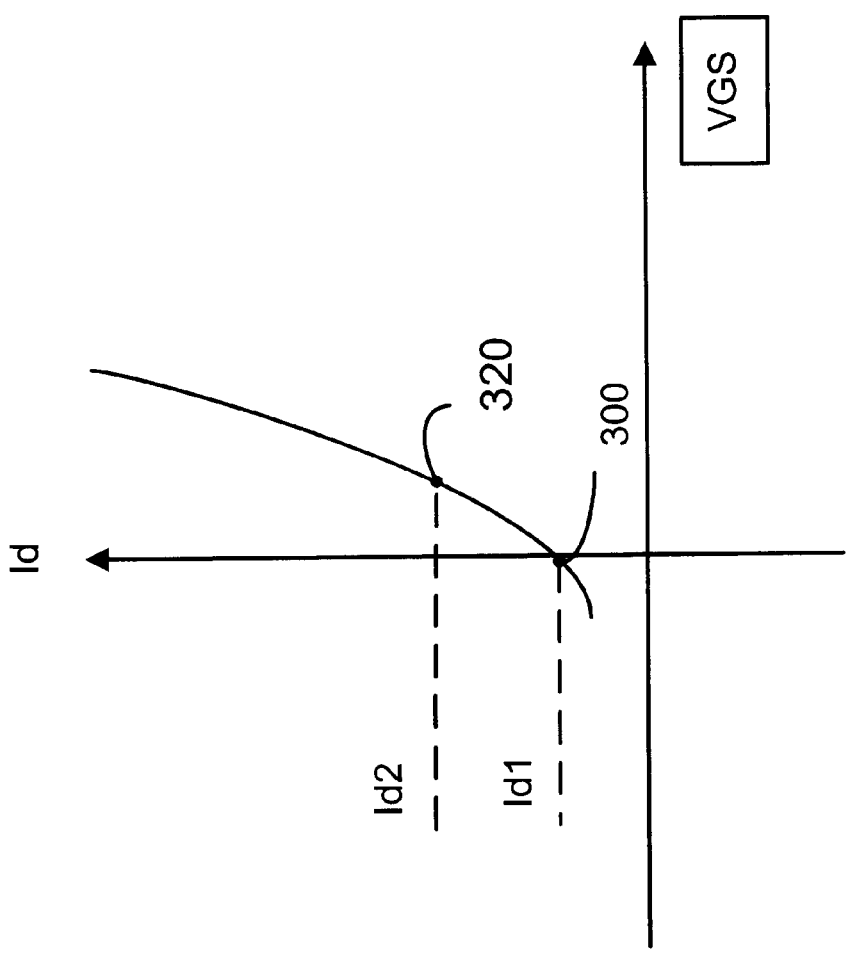
FIG. 3 illustrates a transistor output characteristic for the access transistors of the invention.

In an embodiment of the SRAM cell of the invention, leakage current through access transistor 202, 204 is controlled by the voltage on wordline 206. FIG. 3 illustrates the typical characteristic of the access transistor 202, 204. When the voltage on word line 206 is at VDD, as it would typically be during the idle state, and node 212 is also at VDD, the gate to source voltage VGS of the access transistor is virtually zero. This point on the characteristic curve for transistor 202 is illustrated in FIG. 3 as the point 300. As can be seen from the characteristic curve in FIG. 3, if additional leakage current is desired through access transistor 202, the voltage on wordline 206 can be decreased, thereby increasing the gate to source voltage and pushing the current $I_d$ up in value. This point is noted on the curve of FIG. 3 as point 302.

Controlling leakage through access transistor 202 using the voltage on wordline 206 is tricky. As those of average skill in the art will recognize, the characteristic of transistor 202 is exponential such that there is a fine line between turning on transistor 202 sufficiently to produce a requisite magnitude of leakage current versus turning the transistor completely on, which would then lead to an undesired access to the cell. Moreover, the leakage seen at any given output node of any given cell in a large memory array will vary, as will the leakage for all of the nodes based on processing parameters, temperature and supply voltage.

Figure 4:
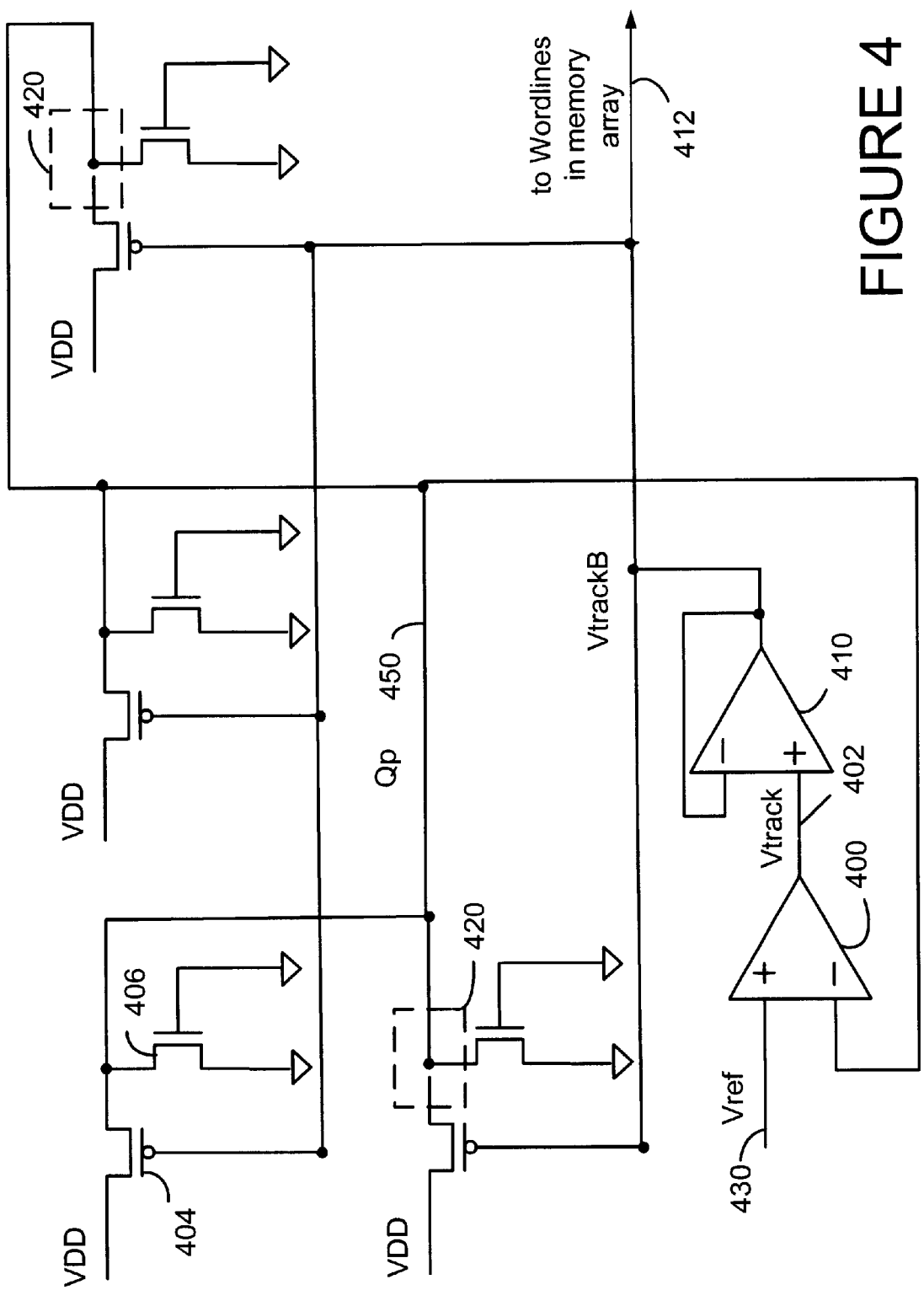
FIG. 4 illustrates a leakage current control circuit in accordance with the present invention.

FIG. 4 illustrates an embodiment of a tracking circuit for producing a control signal in accordance with the present invention, through which to control leakage current at the output nodes 212, 214 of the cell of FIG. 2. The tracking circuit includes a plurality of half SRAM cells each configured to have a VDD state on its output node QP 450. Storage transistor 406 is equivalent to the storage transistor 216 in FIG. 2. The gate voltage of device 406 is at or near VSS, the same as for its counterpart (device 216) where node Q 212 is at VDD. Access transistor 402 of FIG. 4 is also equivalent to the access transistor 202 of FIG. 2. Node QP 450 corresponds to node 212 in FIG. 2. The drain of transistor 402 is coupled to VDD in FIG. 4, just as its counterpart 202 would be via the bit line 208 during normal operation of the cell in FIG. 2. Voltage Vtrack 402 is an output voltage generated by differential amplifier 400, and is coupled to the wordlines 206 of all of the cells in the memory array, including those of the half cells.

The differential amplifier 400 compares the voltage on node QP 450 with VDD. The amplifier 400 adjusts its output voltage Vtrack 402 to keep the difference between VREF 430 and voltage at QP 450 at zero. Thus, if the leakage through transistor 406 from QP 450 has caused the voltage on QP 450 to go much below VREF 430, the voltage VtrackB 412 on wordline will be lowered, thereby increasing the amount of charge transferred through the transfer device 404 from VDD to QP 450, and thereby raising the voltage on QP 450 back up toward VREF 430. Because the VtrackB voltage is also coupled to the real memory cells via wordline 412, the leakage through the access devices of the real memory cells also increases to the same degree, serving to maintain output the state of the cells.

With reference to FIG. 4, it should be noted that the voltage V-track 402 can be buffered using buffer configurations such as that of buffer 410 in FIG. 3. This buffer insures that the disturbances caused by the constant switching of the word line state do not interfere with the tracking process that is accomplished through amplifier 400. The result is a buffered control signal VtrackB 412.

As previously stated, ideally VREF would not be higher than it has to be, because the greater the voltage at node 408 the greater the voltage at word line 208 which in turn creates relatively higher leakage currents that must be conducted by transistors 216 and 218. The optimal voltage for V-track 402 will of course be that voltage value that guarantees that the leakage current through access transistors is just great enough to exceed the leakage current through the storage transistor 216 of FIG. 2. Because that number will vary across the process window, the ideal voltage will vary from lot to lot, from wafer to wafer within lots, as well as across a single chip.

Therefore, there is a tradeoff between the power dissipation due to the increase in leakage current versus the ability to guarantee that the leakage through the access transistors across the process window will never be exceeded by the leakage through the storage devices. Put another way, there is a tradeoff between the degree to which the access transistor leakage is permitted to exceed the leakage of the storage device and the yield of the circuits over the process window.

In the embodiment of the tracking circuit of FIG. 4, VREF 430 is a programmable reference voltage that can be either established from outside the chip through a pin, or could be programmed using known techniques involving programmable fuses. Either way, VREF 430 is determined based on a characterization of the process and a determination of an appropriate trade off between the increased power dissipation that is a result of increasing the leakage currents through the access transistor, and the yield of the circuit during manufacture. By using the tracking circuit of FIG. 4, the established VREF voltage will be maintained by the tracking circuit as parameters such as ambient temperature and power supply voltage vary.

The number of half cells used in the tracking circuit, and the extent to which they are spread across a chip will effect the average leakage that is detected by the tracking circuit. The more half cells or dummy cells that are provided and the more dispersed, the more accurate the average leakage used to generate the Vtrack 402 control signal. The average leakage ratio, however, may not the most desirable basis for establishing VtrackB 412 with respect to circuit yield. Using the average leakage may produce a circuit yield that is not much better than 50 percent. Thus, the half-cell structures that are used to track the average leakage ratio can be modified such that the tracking circuit produces a VtrackB signal that accommodates those storage transistors with higher leakage than the average. This is can be accomplished by breaking the connection between the access transistor 404 and node 408, and increasing the number of n-channel storage devices in the half cell structure, both of which increase the leakage seen flowing out of node QP 450. The disconnects are highlighted by boxes 420 in FIG. 4. In this way, the tracking circuit can be fooled into seeing an "average" leakage that is significantly greater than the actual average leakage seen at the output nodes 212, 214 of the real memory cells.

Figure 5:
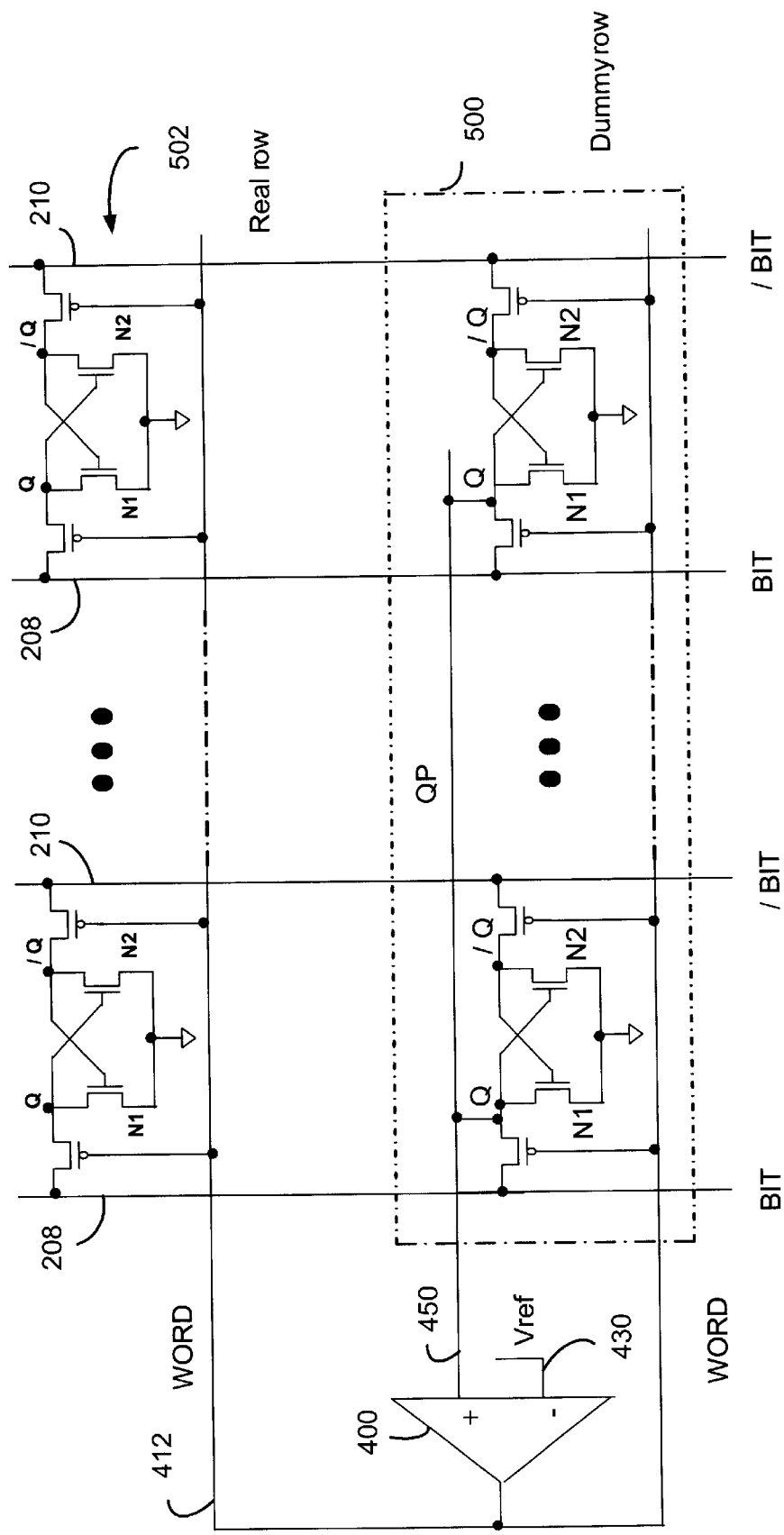
FIG. 5 illustrates chip level diagram of an embodiment of the control circuit of the present invention.

FIG. 5 illustrates an embodiment of the tracking circuit that intersperses one or more dummy rows 500 of memory cells with real memory rows 502. In this case, whole cells are used for the dummy rows 500, but only one of the cell's sides is actually coupled to the QP node 450. This embodiment does not show the buffer circuit 410 of FIG. 4, but buffering the Vtrack signal 412 to the wordline is desirable for the reasons already cited.

Although the power dissipation due to the leakage is less than what it would be using a fixed leakage ratio, the overall leakage current is still being increased because the current through the access device is being increased to overwhelm the storage leakage current. Moreover, this additional current detracts from the read current during a read access, which slows down that operation. Therefore, it may be more desirable to maintain the data at Q 212 (Qbar 214) while reducing rather than increasing the overall leakage. The following two embodiments of the invention operate to reduce the leakage through the storage devices.

Figure 6:
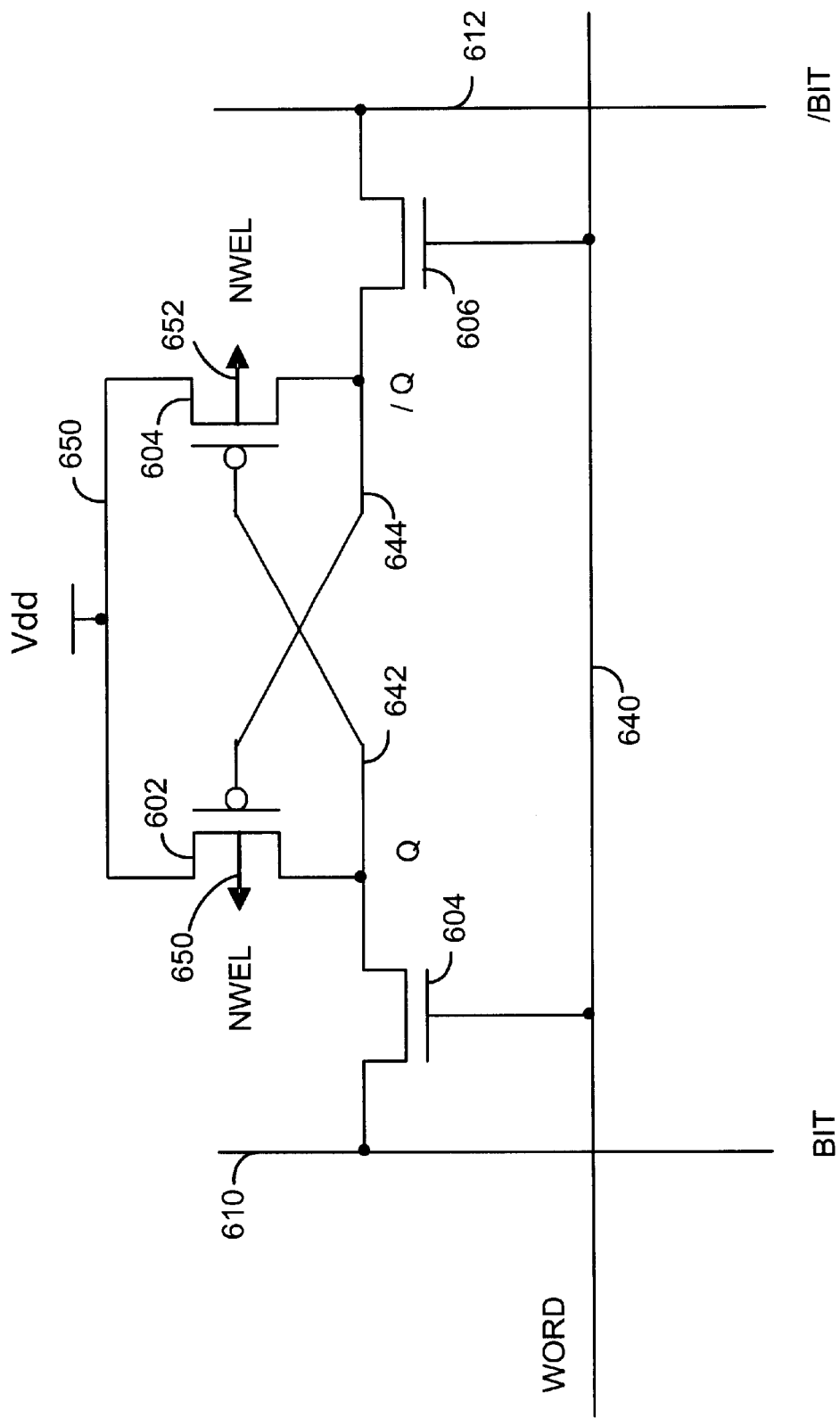
FIG. 6 illustrates an embodiment of the memory cell of the invention where an n-well bias voltage is used to control the leakage current.

An embodiment of the SRAM cell of FIG. 6 demonstrates a mirrored configuration to the SRAM cell of FIG. 2. In this case, the storage devices 602, 604 are p-channel pull-up devices to VDD 650 rather than n-channel pull-down devices (216, 218 FIG. 2) to VSS (220, FIG. 2). The access devices 604, 606 are now n-channel rather than the p-channel devices 202, 204 of FIG. 2. Those of average skill will recognize that these two topologies are mirrored images of one another and are virtually the same in ultimate functionality, even though internally they operate in opposite manner with respect to the power rails.

In the embodiment of FIG. 6, the cell is manufactured in a P-substrate process wherein the p-channel storage devices 602, 604 are isolated from the substrate with an N-well 650, 652.

The substrate is typically reverse biased with respect to the P-substrate. The leakage through the storage devices 602, 604 may be controlled by the tracking circuit of FIGS. 4 and 5. The N-well to P substrate bias voltage of both the real memory cells as well as the dummy or half cells of the tracking circuit are adjusted by the VtrackB signal 412. The Bit lines 610, 612 also should be kept mostly at "0" (i.e. VSS) to help in maintaining the "0" data on the Q 642 or /Q 644. Those of average skill in the art will recognize that this technique could also be applied to the cell of FIG. 2, if manufactured in an n-substrate process using a p-well to isolate storage devices 202, 204.

Figure 7:
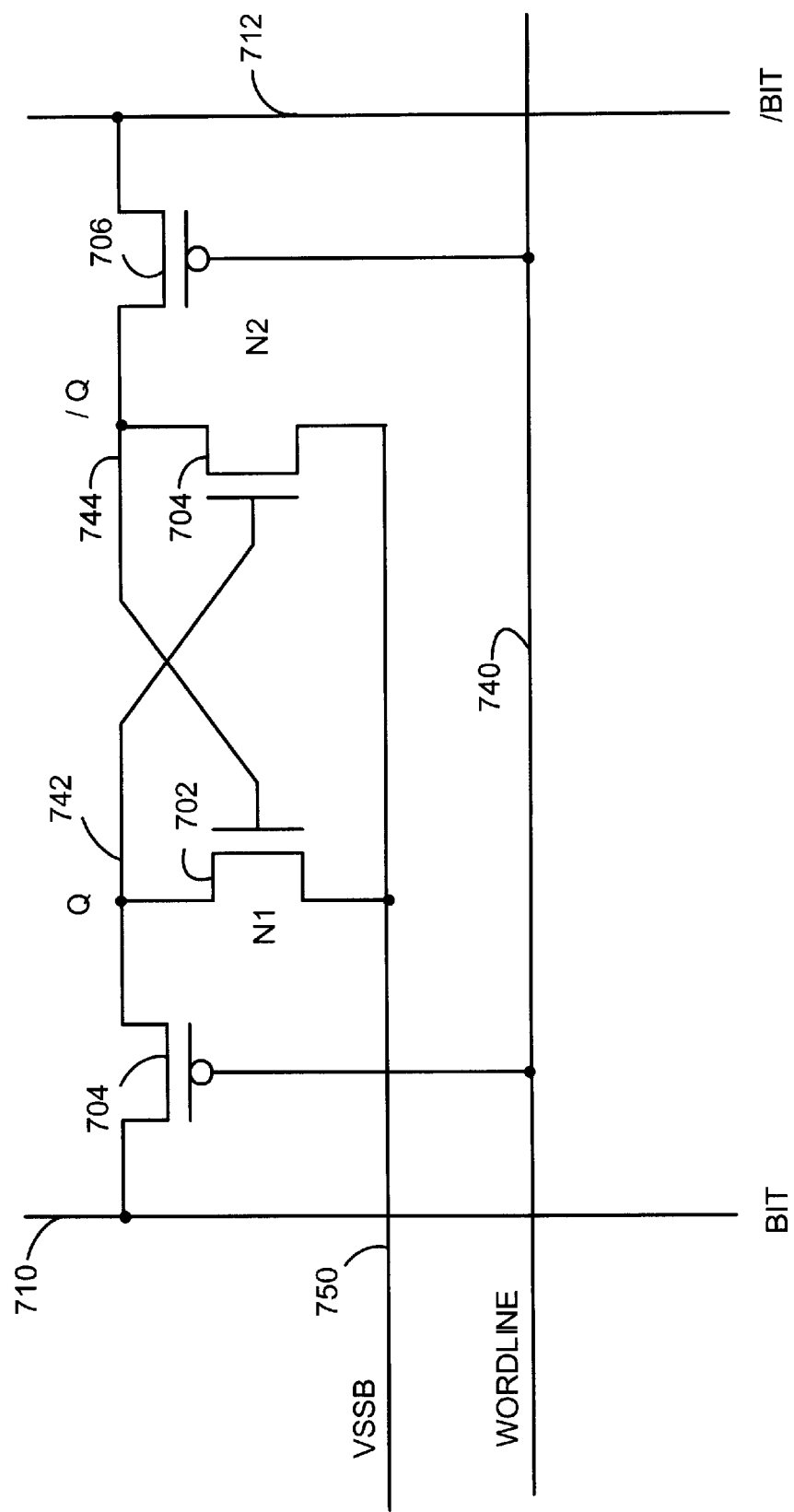
FIG. 7 illustrates an embodiment of the memory cell of the invention where a Vss voltage is used to control the leakage current.

An embodiment of the memory cell of the invention is illustrated in FIG. 7 wherein the voltage for controlling the leakage current ratio is a bias voltage on VSSB 750. Raising the level of VSSB decreases the amount of leakage that flows through the storage devices 702, 704. Once again, this can be accomplished with the tracking circuit of FIGS. 4 and 5, using the VtrackB 412 control signal to control the level of VSSB of the real memory cells as well as the dummy or half cells.

The invention is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A dense memory cell comprising:
   two access transistors, each having a gate tied to a wordline input, a first one of the access transistors having a drain and source coupled between a bit line and an output node;
   two storage transistors, a first one having a drain and source coupled between the output line and a power signal and a gate couple to an output bar node, the second one having a drain and source coupled between the output bar node and the power rail, and a gate coupled to the output node; and
   a control circuit generating a tracking voltage coupled to the wordline, the track voltage for adjusting the voltage on the wordline during an idle state to ensure that leakage current through the two access transistors exceeds the leakage through the two storage transistors where the output node to which it is coupled is at VDD.

2. The memory cell of claim 1 wherein the tracking voltage is a function of a reference voltage determined to provide a leakage through the access transistors that exceeds the leakage through the storage devices.

3. The memory cell of claim 2 wherein the tracking voltage is maintained substantially constant by a differential amplifier.

4. The memory cell of claim 3 wherein the tracking voltage is buffered to substantially reduce disturbances to VREF resulting from switching states on the wordline.

5. The memory cell of claim 3 wherein the tracking voltage is generated by a reference circuit, the reference circuit comprising
   a plurality of partial memory cells, each partial memory cell comprising one access transistor and storage transistor configured in a worst case leakage condition; and
   a differential amplifier having a voltage reference input and a second input coupled to an output node of each of the partial memory cells, the output of the differential amplifier being the tracking voltage.

6. The memory cell of claim 1 wherein the tracking voltage is coupled to an N-well comprising storage transistors.

7. The memory cell of claim 1 wherein the tracking voltage is coupled to the $V_{ss}$ connection to which the storage transistors are coupled.

8. A method of maintaining a preferred leakage ratio between access and storage devices in a memory cell, said method comprising:
   establishing a reference voltage that is equal to a desired output voltage of the cell;
   generating a tracking signal required to force the reference voltage onto an output of a dummy circuit; and
   coupling the tracking signal to a point in the memory cell whereby the leakage ratio is favorably maintained.

9. A dense memory cell comprising:
   two access transistors, each having a gate tied to a well bias input, a first one of the access transistors having a drain and source coupled between a bit line and an output node;
   two storage transistors, a first one having a drain and source coupled between the output line and a power signal and a gate couple to an output bar node, the second one having a drain and source coupled between the output bar node and the power signal, and a gate coupled to the output node; and
   a control circuit generating a tracking voltage coupled to the well bias, the track voltage for adjusting the voltage on the well bias during an idle state to ensure that leakage current through the two access transistors exceeds the leakage through the two storage transistors where the output node to which it is coupled is at VDD.

10. The memory cell of claim 9 wherein the track voltage is a function of a reference voltage determined to provide a leakage through the storage transistors that is less than the leakage through the access devices.

11. A dense memory cell comprising:

two access transistors, each having a gate tied to a power signal input, a first one of the access transistors having a drain and source coupled between a bit line and an output node;

two storage transistors, a first one having a drain and source coupled between the output line and the power signal and a gate couple to an output bar node, the second one having a drain and source coupled between the output bar node and the power rail and a gate coupled to the output node; and a control circuit generating a tracking voltage coupled to the power signal, the track voltage for adjusting the voltage on the power signal during an idle state to ensure that leakage current through the two access transistors exceeds the leakage through the two storage transistors where the output node to which it is coupled is at VDD.

12. The memory cell of claim 10 wherein the track voltage is a function of a reference voltage determined to provide a leakage through the storage transistors that is less than the leakage through the access devices.

* * * * *